(12) United States Patent
Shigemori et al.

(10) Patent No.: US 12,119,683 B2
(45) Date of Patent: Oct. 15, 2024

(54) BATTERY MANAGEMENT DEVICE AND BATTERY DEVICE

(71) Applicant: DENSO CORPORATION, Kariya (JP)

(72) Inventors: Shogo Shigemori, Kariya (JP); Shunichi Kubo, Kariya (JP); Takeshi Iida, Kariya (JP); Yukihiro Tomonaga, Kariya (JP); Taisuke Kurachi, Kariya (JP); Shozo Suzuki, Kariya (JP); Shinya Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 490 days.

(21) Appl. No.: 17/502,315

(22) Filed: Oct. 15, 2021

(65) Prior Publication Data

US 2022/0131389 A1    Apr. 28, 2022

(30) Foreign Application Priority Data

Oct. 23, 2020  (JP) .................................. 2020-178239
Mar. 23, 2021  (JP) .................................. 2021-049208

(51) Int. Cl.
| | | |
|---|---|---|
| *H02J 7/00* | (2006.01) | |
| *B60L 58/10* | (2019.01) | |
| *B60L 58/12* | (2019.01) | |
| *B60L 58/22* | (2019.01) | |
| *G01R 31/382* | (2019.01) | |
| *G01R 31/3842* | (2019.01) | |
| *G01R 31/392* | (2019.01) | |
| *G01R 31/396* | (2019.01) | |
| *H01M 10/42* | (2006.01) | |
| *H01M 10/48* | (2006.01) | |

(52) U.S. Cl.
CPC ............ *H02J 7/0014* (2013.01); *B60L 58/10* (2019.02); *B60L 58/12* (2019.02); *B60L 58/22* (2019.02); *G01R 31/382* (2019.01); *G01R 31/3842* (2019.01); *G01R 31/392* (2019.01); *G01R 31/396* (2019.01); *H01M 10/425* (2013.01); *H01M 10/482* (2013.01); *H02J 7/0069* (2020.01); *H01M 2010/4271* (2013.01); *H02J 7/0019* (2013.01)

(58) Field of Classification Search
CPC ...... H02J 7/0014; H02J 7/0069; H02J 7/0019; B60L 58/10; B60L 58/12; B60L 58/22; G01R 31/382; G01R 31/3842; G01R 31/392; G01R 31/396; H01M 10/425; H01M 10/48; H01M 2010/4271
USPC ..................... 320/109, 116–119, 134; 701/22
See application file for complete search history.

(56) References Cited

U.S. PATENT DOCUMENTS

| | | | | |
|---|---|---|---|---|
| 2007/0257642 | A1* | 11/2007 | Xiao | .................... H02J 7/00308 320/134 |
| 2015/0260796 | A1 | 9/2015 | Vinit et al. | |
| 2017/0098940 | A1* | 4/2017 | Syouda | ................. H02J 7/0016 |

FOREIGN PATENT DOCUMENTS

| | | |
|---|---|---|
| JP | 2006284538 A | 10/2006 |
| JP | 2010141957 A | 6/2010 |
| WO | 2010106588 A1 | 9/2010 |

* cited by examiner

*Primary Examiner* — Zixuan Zhou
(74) *Attorney, Agent, or Firm* — Posz Law Group, PLC

(57) ABSTRACT

A battery management device is configured to set a limited measurement range that limits a range for measuring a voltage of each of a plurality of batteries for a vehicle. The battery management device is configured to measure the voltage of each of the plurality of batteries within the limited measurement range.

9 Claims, 11 Drawing Sheets

BATTERY MANAGEMENT DEVICE AND BATTERY DEVICE

CROSS REFERENCE TO RELATED APPLICATIONS

This application is based on Japanese Patent Application No. 2021-049208 filed on Mar. 23, 2021 and Japanese Patent Application No. 2020-178239 filed on Oct. 23, 2020. The entire disclosures of all of the above applications are incorporated herein by reference.

TECHNICAL FIELD

The present disclosure relates to a battery management device and a battery device.

BACKGROUND

A battery device that performs an equalization process for each battery block in order to rapidly reduce voltage variations for multiple batteries has been proposed.

SUMMARY

The present disclosure provides a battery management device and a battery device. The battery management device is configured to set a limited measurement range that limits a range for measuring a voltage of each of a plurality of batteries for a vehicle. The battery management device is configured to measure the voltage of each of the plurality of batteries within the limited measurement range.

BRIEF DESCRIPTION OF DRAWINGS

The features and advantages of the present disclosure will become more apparent from the following detailed description made with reference to the accompanying drawings. In the drawings.

DETAILED DESCRIPTION

In a device for managing a state of a battery, it is important to perform an equalization of the battery, an estimation of a state of charge (SOC) of the battery, an estimation of a degree of deterioration of the battery (SOH), and the like with high accuracy. Thus, it is required to improve measurement accuracy of battery voltage.

The present disclosure provides a battery management device and a battery device capable of improving an accuracy of voltage measurement.

An exemplary embodiment of the present disclosure provides a battery management device that includes a range setting unit and a measuring unit. The range setting unit sets a limited measurement range that limits a range for measuring a voltage of each of a plurality of batteries for a vehicle. The measuring unit measures the voltage of each of the plurality of batteries within the limited measurement range.

Another exemplary embodiment of the present disclosure provides a battery device that includes a plurality of batteries for a vehicle, a range setting unit, and a measuring unit. The range setting unit sets a limited measurement range that limits a range for measuring a voltage of each of a plurality of batteries for a vehicle. The measuring unit measures the voltage of each of the plurality of batteries within the limited measurement range.

In the exemplary embodiment of the present disclosure, the range setting unit can set the limited voltage measurement range from the entire voltage range of the battery. Since this configuration can set an appropriate voltage measurement range, the accuracy of voltage measurement can be improved.

The following will describe embodiments for carrying out the present disclosure with reference to the drawings. In each embodiment, a constituent element corresponding to a constituent element in a preceding embodiment with a reference sign or numeral may be denoted by the same reference sign or numeral, to omit redundant explanation. When only a part of a configuration is described in an embodiment, another preceding embodiment may be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

First Embodiment

A first embodiment will be described with reference to FIGS. 1 to 4. A battery management device may be applied to management of a secondary battery mounted on a vehicle such as a hybrid vehicle, an electric vehicle, or a fuel cell vehicle. Vehicles include passenger cars, buses, construction work vehicles, agricultural machinery vehicles, and the like. Secondary batteries include a lithium ion secondary battery, a nickel hydrogen secondary battery, an organic radical battery, and the like.

Figure 1:
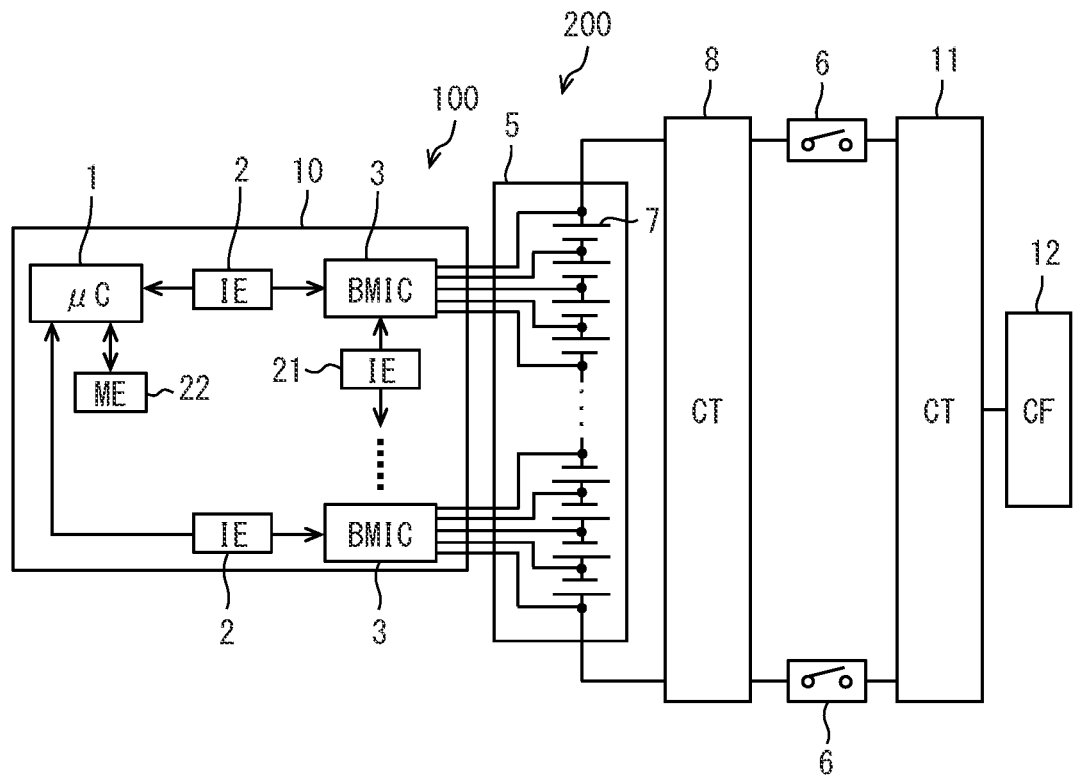
FIG. 1 is a configuration diagram related to a battery device.

FIG. 1 shows a configuration related to a battery device 200 and an external device for charging an assembled battery 5. The battery device 200 includes the assembled battery 5 and a battery management device 100.

The battery management device 100 includes a control device 10 related to the assembled battery 5. The external device includes a charging facility (CF) 12 and a charging terminal (CT) 11. A charge and discharge circuit (CDC) 8 mounted on the vehicle enables exchange of electric power between the assembled battery 5 and the charging terminal 11.

The battery management device 100 is provided in the vehicle described above. The battery management device 100 functions as a management device for monitoring and controlling charge and discharge of the assembled battery 5 including the secondary battery in the vehicle described above. The assembled battery 5 can be charged by the external device.

A power process is provided between the battery management device 100 and the charging equipment 12 to allow electric power to flow in one direction or in both directions. The charging equipment 12 is a power supply device arranged in a house, a business establishment, or the like. The charging equipment 12 is configured as a simple power outlet or a charging stand for charging.

The charging terminal 11 is a portable or stationary device. The charging terminal 11 can be arranged in the charging equipment 12 or the vehicle. The charging terminal 11 communicates with the vehicle using a dedicated signal line. The charging terminal 11 can also be configured as a charger. A system main relay 6 can switch between the charging terminal 11 and the assembled battery 5 between an electrical conduction state and a non-electrical conduction state.

The charging equipment 12 includes an AC power supply and an outlet that outputs electric power supplied from the AC power supply. The AC power is supplied from a small power generation facility or a wide area power grid. The outlet is located outside the facility that provides the charging facility 12 and is capable of accepting a predetermined plug. The outlet and the plug provide a connecting device for connecting the charging equipment 12 and the charging terminal 11.

The vehicle equipped with the battery management device 100 has an inlet. The inlet provides an input side connector for the charging terminal 11. The inlet has a terminal group including multiple terminals for DC power and multiple terminals for data communication.

The charging terminal 11 includes a plug capable of being connected to the outlet of the charging equipment 12. The plug is capable of being electrically conducted with AC power. The charging terminal 11 includes a connector capable of being connected to the inlet of the vehicle. The connector is also referred to as a charging gun. The connector has a terminal group including multiple terminals for AC power and multiple terminals for data communication. The vehicle inlet and the connector of the charging terminal 11 provide a connecting device for connecting the charging terminal 11 and the vehicle. The charging terminal 11 includes a control device that adjusts electric power supplied to the plug of the charging terminal 11 and supplies the adjusted electric power to the connector. The control device of the charging terminal 11 includes a switch circuit that interrupts power supply to the connector. The control device of the charging terminal 11 may include a voltage conversion circuit.

The control device of the charging terminal 11 is also a communication device for communicating with the vehicle via the connector of the charging terminal 11. The control device of the charging terminal 11 cooperates with the control device 10 of the battery management device 100 to perform a charging process for controlling charge of the assembled battery 5. The control device of the charging terminal 11 transmits a signal indicating that electric power can be supplied from the charging terminal 11 by the CPLT signal. Further, the control device of the charging terminal 11 receives a signal indicating that the assembled battery 5 is capable of being discharged by the CPLT signal. The control device of the charging terminal 11 interrupts the power supply from the charging terminal 11 to the assembled battery 5.

The assembled battery 5 supplies electric power to an electric motor for traveling provided in the vehicle. The assembled battery 5 includes a high capacity and a high voltage capable of being used as a power source for traveling of the vehicle. The assembled battery 5 includes multiple battery groups connected in series or in parallel. The battery group includes multiple battery cells 7 connected in series. The battery cell 7 is provided by a secondary battery.

The charge and discharge circuit 8 is mounted on the vehicle. The charge and discharge circuit 8 functions as a charging circuit that rectifies and transforms electric power supplied to the inlet of the vehicle and supplies electric power to the assembled battery 5. The charge and discharge circuit 8 also functions as a discharge circuit that converts the DC power obtained from the assembled battery 5 into AC power and outputs the AC power to the inlet of the vehicle. The charge and discharge circuit 8 enables charge of the assembled battery 5 from the AC power supply of the charging facility 12 and reverse power flow from the assembled battery 5 to the AC power supply. The charge and discharge circuit 8 may include an inverter circuit and a voltage converter circuit. The control device 10 of the battery management device 100 controls the charge and discharge circuit 8.

The control device 10 includes a monitoring IC (BMIC) 3, an insulating element (IE) 2, and a microcomputer (μC) 1. The monitoring IC 3 functions as a measuring unit that measures the voltage (voltage between terminals) between the anode and the negative electrode of each battery cell 7. One monitoring IC 3 measures, for example, the voltage between terminals of each battery cell 7 included in one battery group.

The microcomputer 1 and each monitoring IC 3 are insulated by an insulating element 2. The microcomputer 1 acquires the voltage between terminals measured by each monitoring IC 3 via the insulating element 2. The microcomputer 1 monitors each battery cell 7 through each monitoring IC 3 and manages the state of the assembled battery 5 such as the charge and discharge state. The monitoring IC 3 and the monitoring IC 3 are insulated by an insulating element (IE) 21. This insulation configuration ensures the communication performance between the monitoring ICs 3 each of which has different GND level.

The microcomputer 1 adjusts a voltage measurement range in the battery cell 7 to set a limited measurement range. The microcomputer 1 sets the limited measurement range when the vehicle is in a state where the influence of noise is small. The microcomputer 1 functions as a range setting unit capable of setting an arbitrary limited measurement range among the voltages in the entire range of the battery cell 7. The microcomputer 1 sets the voltage measurement range adjusted by the command transmitted to the monitoring IC 3 as the limited measurement range. The monitoring IC 3 interprets the command output from the microcomputer 1 and operates in the voltage measurement range included in this command.

As an example, the microcomputer 1 sets a limited measurement range with the following logic. The microcomputer 1 sets a limited measurement range including a maximum value. The maximum value is among the voltage measurement values measured by the monitoring IC 3 for the voltage in the entire range in the battery cell 7. The microcomputer 1 sets a limited measurement range including a minimum value. The minimum value is among the voltage measurement values measured by the monitoring IC 3 for the voltage in the entire range in the battery cell 7. The microcomputer 1 sets a limited measurement range using the maximum value and the minimum value among the voltage measurement values measured by the monitoring IC 3 for the voltage in the entire range in the battery.

Figure 2:
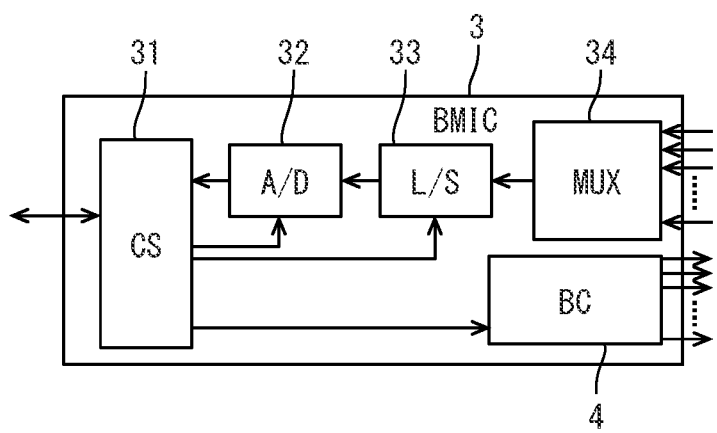
FIG. 2 is a configuration diagram of a monitoring IC.

As shown in FIG. 2, the monitoring IC 3 includes a command unit (CS) 31, an analog-digital converter (A/D) 32, a level shifter (L/S) 33, and a switch group (MUX) 34. The monitoring IC 3 further includes an equalization circuit (BC) 4.

The command unit 31 includes a serial I/O, a non-volatile memory, and a digital filter, and has a function of interpreting a command from the microcomputer 1.

The analog-digital converter 32 includes an A/D converter that is provided by an electronic circuit that converts an analog electric signal into a digital electric signal, and a clamp circuit that limits the input range of the A/D converter. The number of quantization bits of the A/D converter is a fixed value. The input range of the A/D converter is controlled by controlling the clamp circuit by the command unit 31.

The switch group 34 has a function of arbitrarily selecting the voltage of each battery cell 7. The switch group 34 has a function of selecting multiple inputs and outputting them as one signal.

The level shifter 33 functions as a level shifter and a gain sector. The level shifter 33 includes an operational amplifier and multiple feedback circuits connected in parallel between an input terminal and an output terminal of the operational amplifier. This feedback circuit includes a switch and a capacitor connected in series. The capacitances of the capacitors included in the multiple feedback circuits may be the same or different.

The switches of the multiple feedback circuits included in the level shifter 33 are selectively controlled between the electrical conducted state and the cutoff state. As a result, the number of capacitors connected between the input terminal and the output terminal of the operational amplifier changes. The capacitance between the input terminal and the output terminal of the operational amplifier changes. In addition, the resistance between the input terminal and the output terminal of the operational amplifier changes. As a result, the gain and offset of the level shifter 33 are controlled.

By limiting the input range of the analog-digital converter 32 and adjusting the gain and offset of the level shifter 33, the voltage range of the analog electric signal to be converted into the digital signal by the analog-digital converter 32 is controlled. The voltage range of the voltage of the battery cell 7 to be converted into the digital signal by the analog-digital converter 32 is controlled. As a result, the voltage measurement range is adjusted.

The monitoring IC 3 measures the voltage of the battery cell 7 in the voltage measurement range set by the microcomputer 1. The monitoring IC 3 functions as a measuring unit that measures the voltage of the battery cell 7 in the limited measurement range set by the microcomputer 1.

Figure 3:
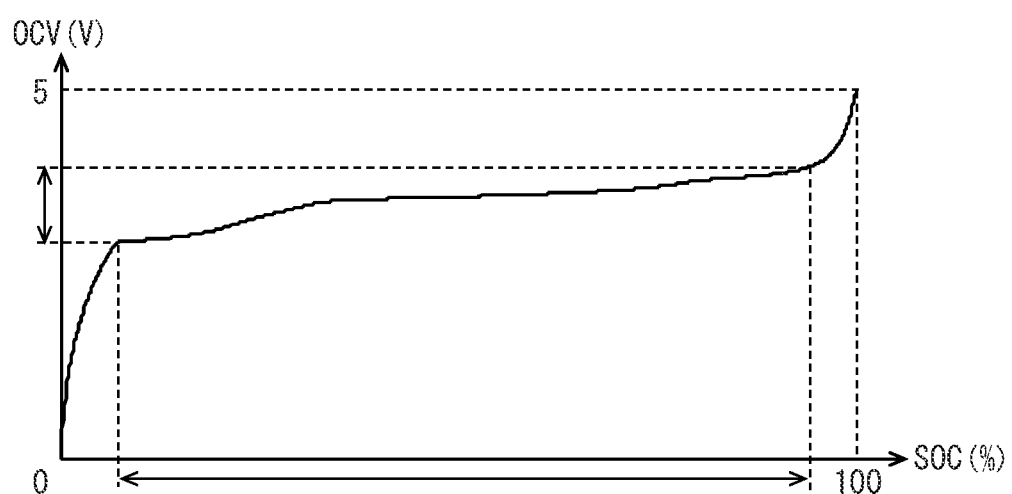
FIG. 3 is a characteristic diagram showing a relationship between OCV and SOC regarding a battery cell.

The battery cell 7 included in the assembled battery 5 has a unique characteristic regarding the relationship between the State of Charge (SOC) and the Open Circuit Voltage (OCV). In this specification, the state of charge of the battery cell 7 may be described as SOC. When the battery cell 7 is provided by a lithium ion secondary battery, the battery cell 7 has characteristic data as shown in FIG. 3 as an example. The characteristic data as shown in FIG. 3 is stored in the storage unit (ME) 22 of the control device 10. The temperature dependence of the characteristic data for SOC and OCV of various secondary batteries is stored in the storage unit 22. The characteristic data according to the type and temperature of the battery cell 7 is read out by the microcomputer 1. The storage unit 22 may be built in the microcomputer 1. In the drawings, the microcomputer 1 and the storage unit 22 are shown separately in order to clearly indicate the components.

The microcomputer 1 functions as an SOC estimation unit that estimates the SOC of the battery cell 7 by a calculation using the voltage between terminals of the battery cell 7 measured by the monitoring IC 3 and this characteristic data. The microcomputer 1 functions as an SOC estimation unit that estimates the SOC based on a voltage measurement value measured in the entire voltage range of the battery cell 7. The microcomputer 1 functions as an SOC estimation unit that estimates the SOC based on the measured voltage measurement value.

The characteristic data shown in FIG. 3 shows the relationship between the SOC of the battery cell 7 and the open circuit voltage. This characteristic data includes a low change region in which the voltage change width with respect to the SOC is equal to or less than a predetermined value. The characteristic data includes a high change region in which the voltage change is greater than the low change region in each of the SOC range lower than the low change region and the SOC range higher than the low change region.

The low change region of the voltage is a range indicated by an arrow on the vertical axis of FIG. 3. The SOC of the battery cell 7 corresponding to the low change region corresponds to a range indicated by an arrow on the horizontal axis of FIG. 3. The entire range of the voltage between the terminals of the battery cell 7 includes a low change region in which the voltage change width with respect to the SOC is smaller than the low SOC region and the high SOC region.

The microcomputer 1 functions as a range setting unit that sets a limited measurement range based on the unique characteristics of the battery cell 7 showing the relationship between the SOC and the open circuit voltage. It is preferable that the microcomputer 1 sets the voltage range included in the low change region as the limited measurement range among the voltages in the entire range related to the battery cell 7. The control device 10 has a function capable of measuring the voltage with high precision and accurately estimating the storage state regarding the battery cell 7 having such characteristics.

The equalization circuit 4 functions as an equalization processing unit that performs a process (equalization process) for reducing voltage variations of the multiple battery cells 7 included in the battery group. The equalization circuit 4 includes a control unit and an equalization circuit unit. The control unit is built in the monitoring IC 3. The equalization circuit unit is connected to each battery cell 7. The equalization circuit unit is built in the monitoring IC3. The equalization circuit unit may be arranged outside the monitoring IC3.

In the equalization process, for example, among the multiple battery cells 7 included in the battery group, a battery cell 7 showing a relatively high voltage measurement value is discharged. At the same time, among the battery cells 7 included in the battery group, a battery cell 7 showing a relatively low voltage measurement value is charged. As a result, the SOCs of the multiple battery cells 7 included in the battery group are equalized.

When the equalization process condition is satisfied, the microcomputer 1 transmits, to the equalization circuit 4, a signal to instruct the corresponding battery group to perform the equalization process. When the equalization process condition is not satisfied, the microcomputer 1 does not transmits, to the equalization circuit 4, a signal to instruct the corresponding battery group to perform the equalization process. When the equalization process condition is not satisfied, the microcomputer 1 may transmit a signal prohibiting the equalization process to the equalization circuit 4.

The microcomputer 1 functions as an equalization determination unit that determines whether or not to perform the equalization process according to whether or not the equalization processing condition is satisfied or not. When the difference between the maximum voltage measurement value and the minimum voltage measurement value measured in a predetermined battery group among the multiple battery groups is smaller than a determination threshold value, the microcomputer 1 determines that the equalization process is not performed. When the difference between the maximum voltage measurement value and the minimum voltage measurement value is greater than the determination threshold value, the microcomputer 1 determines that the equalization process is performed.

The control device in the present disclosure may refer to as an electronic control unit (ECU). The control device or the control system is provided by (a) an algorithm as multiple logic called an if-then-else form, or (b) a learned model tuned by machine learning, e.g., an algorithm as a neural network.

The control device is provided by a control system including at least one computer. The control system may include multiple computers linked by a data communication device. The computer includes at least one processor (hardware processor) that is hardware. The hardware processor can be provided by the following (i), (ii), or (iii).

(i) The hardware processor may be at least one processor core that executes a program stored in at least one memory. In this case, the computer is provided with at least one memory and at least one processor core. The processor core may be provided by a central processing unit (CPU), a graphics processing unit (GPU), a RISC-CPU, or the like. The memory is also referred to as a storage medium. The memory is a non-transitory and tangible storage medium that non-transitorily stores "program and/or data" readable by the processor. The storage medium may be a semiconductor memory, a magnetic disk, an optical disk, or the like. The program may be distributed as a single unit or as a storage medium in which the program is stored.

(ii) The hardware processor may be a hardware logic circuit. In this case, the computer is provided with a digital circuit including a number of programmed logic units (gate circuits). The digital circuit may be provided by a logic circuit array, for example, ASIC: Application-Specific Integrated Circuit, FPGA: Field Programmable Gate Array, SoC: System on a Chip, PGA: Programmable Gate Array, or CPLD: Complex Programmable Logic Device. The digital circuit may include a memory that stores programs and/or data. The computer may be provided by analog circuit. A computer may be provided by a combination of a digital circuit and an analog circuit.

(iii) The hardware processor may be a combination of the above (i) and the above (ii). (i) and (ii) are disposed on different chips or on a common chip. In these cases, the part (ii) is also called an accelerator.

The control device, the signal source, and the control object provide various elements. At least some of these elements may be referred to as a block, a module, or a section. Furthermore, elements included in the control system are referred to as functional means only when intentional.

Next, control related to the battery management of the control device 10 will be described with reference to the flowchart of FIG. 4. In this description, in order to clarify which component included in the control device 10 performs the process, the subject of the sentence explaining the process is, if necessary, described by a component of the control device 10 to perform the process instead of the control device 10. Further, in the drawing, a start is indicated by S and an end is indicated by E.

In S100, the control device 10 is turned on. In S110, the control device 10 determines whether or not the voltage measurement condition is satisfied. In S110, the control device 10 determines that there is no influence of noise when the motor or engine that generates the power to drive the vehicle is stopped and the assembled battery 5 is not charged or discharged. For example, when an ignition switch or a motor start switch is in the off state, the control device 10 determines that the motor or the engine is in the stopped state.

The control device 10 determines that charging or discharging of the battery is stopped, for example, when the inlet of the vehicle and the connector of the charging terminal 11 are not connected. When the inlet of the vehicle and the connector of the charging terminal 11 are not connected, the control device 10 determines that the charging or discharging of the assembled battery 5 is stopped. For example, when the system main relay 6 is in the off state and the charging terminal 11 and the assembled battery 5 are not electrical conducted, the control device 10 determines that the charging or discharging of the assembled battery 5 is stopped. The control device 10 determines that the voltage measurement condition is satisfied when the power device of the vehicle is in the stopped state and the charging or discharging of the assembled battery 5 is stopped. When the voltage measurement condition is satisfied, the control device 10 determines that the noise is acceptable.

Figure 4:
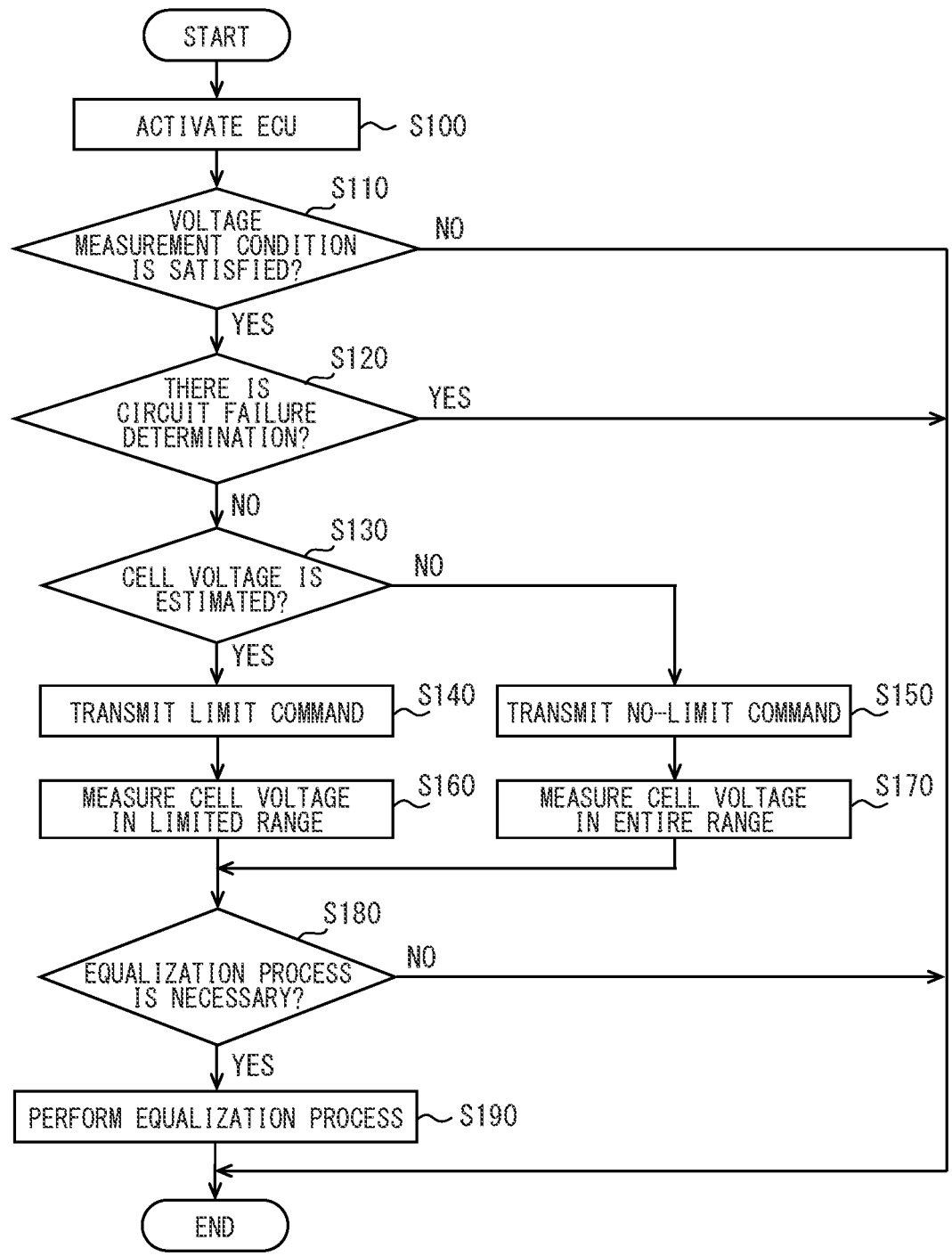
FIG. 4 is a flowchart showing battery management according to a first embodiment.

When determining, in S110, that the voltage measurement condition is not satisfied, the control device 10 terminates the flowchart of FIG. 4. When determining, in S110, that the voltage measurement condition is satisfied, the control device 10 proceeds to S120. In S120, the control device 10 determines whether or not there is a failure in the electric circuit in the battery management device 100. The control device 10 has a function as a failure determination unit that determines whether or not there is a failure in the electric circuit in the battery management device 100. When determining, in S120, that there is a failure in the electric circuit, the control device 10 terminates the flowchart of FIG. 4 without performing the process of setting the limited measurement range.

When determining, in S120, that there is no failure in the electric circuit, the control device 10 proceeds to S130. In S130, the control device 10 determines whether or not the voltage value (cell voltage) of each battery cell 7 is capable of being estimated. When an approximate value of the current voltage value is known, the control device 10 determines in S130 that the voltage value is estimated. For example, when the voltage value is stored in the storage unit 22, the control device 10 determines in S130 that the voltage value is estimated.

When determining, in S130, that the voltage value is estimated, the control device 10 proceeds to S140. When determining, in S130, that the voltage value is not estimated, the control device 10 proceeds to S150.

When determining that the voltage value of each battery cell 7 is estimated, the microcomputer 1 outputs a command for detecting the voltage of the battery cell 7 in a limited range to the monitoring IC 3 as a limit command in S140. The command unit 31 controls the analog-digital converter 32 and the level shifter 33 based on the limit command to control the input range, gain, and offset. As a result, the limited measurement range of the battery cell 7 is set.

When the processing proceeds to S160 through S140, the monitoring IC 3 of the control device 10 measures the voltage of the battery cell 7 in the limited measurement range set in S150, and outputs the measured voltage measurement value to the microcomputer 1. The microcomputer 1 acquires the voltage measured in this limited measurement range and stores the voltage in the storage unit 22. The control device 10 proceeds to S180.

When determining that the voltage value of each battery cell 7 is not estimated, the microcomputer 1 outputs a command for detecting the voltage of the battery cell 7 in an entire range to the monitoring IC 3 as a non-limit command in S150. The command unit 31 controls the analog-digital converter 32 and the level shifter 33 based on the non-limit command to control the input range, gain, and offset. As a result, the measurement range of the battery cell 7 in the entire range is set.

When receiving the non-limit command, the monitoring IC 3 measures the voltage of the battery cell 7 in the entire range in S170, and outputs the measured voltage measurement value to the microcomputer 1. The microcomputer 1 acquires the voltage measured in the entire range and stores the voltage in the storage unit 22. The control device 10 proceeds to S180.

In S180, the microcomputer 1 determines whether or not to perform the equalization process for the battery group. In S180, the microcomputer 1 determines whether or not to perform the equalization process according to whether or not the voltage difference that is the difference between the maximum voltage measurement value and the minimum voltage measurement value related to the multiple battery cells 7 included in the battery group is greater than the determination threshold value. When the voltage difference is smaller than the determination threshold value, the microcomputer 1 terminates the flowchart of FIG. 4 without performing the equalization process. When the voltage difference is greater than the determination threshold value, the microcomputer 1 determines that the equalization process is necessary. The microcomputer 1 controls the equalization circuit 4 in S190 to perform the equalization process. When the voltage difference is smaller than the determination threshold value, the microcomputer 1 determines that the equalization process is unnecessary.

The determination processing in S110 may be performed as follows. In S110, when the power device that provides the driving force of the vehicle is stopped, the charging or discharging of the assembled battery 5 is stopped, or the system main relay 6 is in the off state, the microcomputer 1 determines that noise is acceptable. In S110, when determining that the noise is acceptable, the microcomputer 1 determines the noise level and determines whether or not the noise level is acceptable. When the microcomputer 1 determines that the noise level is acceptable, the microcomputer 1 proceeds to S120. The microcomputer 1 may determine that the voltage measurement condition is satisfied when the noise level is acceptable in a situation where noise is acceptable. When the SN ratio, which is the ratio of the signal and the noise, is equal to or higher than a specified value, the control device 10 determines that the noise is acceptable. When the SN ratio is equal to or less than the specified value, the influence of noise on the signal for voltage detection becomes large and the influence on the voltage detection error becomes large. The source of noise is, for example, an in-vehicle load or an external device connected to the assembled battery 5 such as a power device.

Operational advantages produced by the battery management device 100 according to the first embodiment are described next. The battery management device 100 includes the range setting unit that sets a limited measurement range that limits the voltage measurement range for the battery cell 7 included in the in-vehicle assembled battery 5, and the measuring unit that measures the voltage of the battery cell 7 in the limited measurement range set by the range setting unit. With this configuration, an appropriate voltage measurement range is set in order to improve the accuracy of voltage measurement. By improving the accuracy of voltage measurement, it is possible to contribute to the highly accurate estimations when performing the SOC estimation or the SOH estimation using voltage measurement.

For example, the battery management device 100 narrows the voltage measurement range of the battery cell 7 from the entire range of 0.0V to 5.0V to the limited measurement range of 3.0V to 3.5V. In this limited measurement range, the voltage of the battery cell 7 of the analog electric signal is converted into the digital electric signal by the analog-digital converter 32. As a result, the quantization error of the analog-digital converter 32 is reduced. In the case of the above example, the quantization error is about $\frac{1}{10}$. As a result, the voltage detection accuracy of the battery cell 7 is improved.

The monitoring IC 3 adjusts the voltage measurement range according to the command output from the microcomputer 1 to set the limited measurement range. With this configuration, it is possible to perform appropriate voltage measurement with one control device 10 for the multiple battery cells 7 having different open circuit voltage ranges.

The range setting unit of the battery management device 100 sets the limited measurement range adjusted based on the estimated voltage value when the voltage value of the battery cell 7 is estimated. The range setting unit of the battery management device 100 sets the limited measurement range based on the voltage measurement values performed for the voltage in the entire range when the voltage value of the battery cell 7 is not estimated. For example, the range setting unit of the battery management device 100 sets the limited measurement range based on the voltage measurement values performed for the voltage in the entire range when the voltage value of the battery cell 7 is not stored. With this configuration, after confirming the open circuit voltage of the battery cell 7 to be measured, the limited measurement range is set based on the measured value. Thus, an appropriate voltage measurement range is set in order to improve the accuracy of voltage measurement.

The range setting unit of the battery management device 100 sets the limited measurement range using at least one of the maximum value and the minimum value of the voltage measurement values measured for the entire voltage range. With this configuration, the voltage measurement range is set to the limited measurement range in which the voltage value in the present state is reflected. This configuration improves the accuracy of voltage measurement.

The range setting unit sets the limited measurement range when the noise is an acceptable noise level in a situation where the noise is acceptable. The measuring unit measures the voltage of the battery cell 7 in this limited measurement range. In this configuration, the voltage is measured in the limited measurement range set when the noise level is acceptable in a state where the influence of noise is small. Therefore, the battery management device 100 can perform voltage measurement by separating noise and signal, and further contributes to improvement of voltage measurement accuracy.

The range setting unit sets the limited measurement range when the power device that provides the driving force of the vehicle is stopped and the charging or discharging of the assembled battery 5 is stopped. The measuring unit measures the voltage of the battery cell 7 in this limited measurement range. With this configuration, since the voltage is measured in the limited measurement range set in a state where the influence of noise is small, the voltage measurement in which the noise and the signal are separated is performed. Therefore, the battery management device 100 further contributes to the improvement of the voltage measurement accuracy.

The battery management device 100 includes the equalization determination unit that determines whether or not to perform the equalization process for reducing voltage variations of the multiple battery cells 7 included in a predetermined battery group among the multiple battery groups. The equalization determination unit determines whether or not to perform the equalization process based on the voltage measurement value of the battery cell 7 measured in the limited measurement range. With this configuration, it is possible to determine whether or not to perform the equalization process with high precision based on the high precision voltage measurement value measured in the limited measurement range.

The battery management device 100 includes the SOC estimation unit that estimates the SOC based on the characteristic data indicating the relationship between the open circuit voltage and the state of charge and the voltage measurement value of the battery cell 7 measured in the limited measurement range. With this configuration, it is possible to perform the SOC estimation with high precision by estimation based on the highly accurate voltage measurement value measured in the limited measurement range.

Second Embodiment

A second embodiment will be described with reference to FIGS. 5 and 6. Control related to the battery management of the second embodiment will be described with reference to FIGS. 5 and 6. Configurations, actions, and effects not specifically described in the second embodiment are the same as those in the first embodiment, and only points different from the first embodiment will be described below.

The control related to the battery management of the second embodiment is different from the control related to the battery management of the first embodiment only in the SOC estimation process, the determination process related to the SOH estimation, and the execution process. In S200 to S270 in the flowchart shown in FIG. 5, the same processes as in S100 to S170 shown in FIG. 4 are performed.

Figure 5:
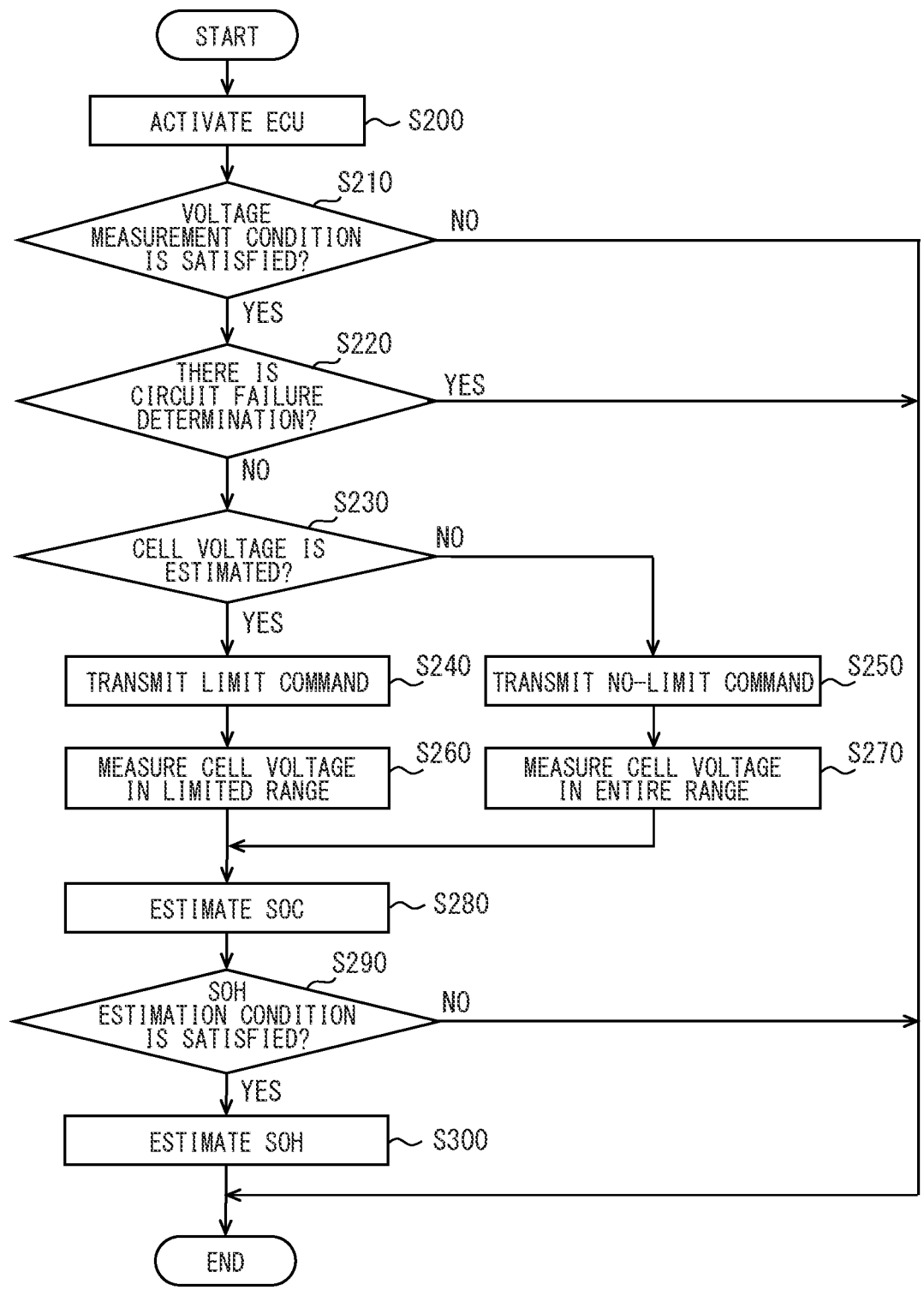
FIG. 5 is a flowchart showing battery management according to a second embodiment.

As shown in FIG. 5, after the voltage measurement is performed in S260 or S270, the control device 10 performs the process of estimating the SOC in S280 as described above. The microcomputer 1 estimates the SOC by calculating the SOC using the measured voltage value and the characteristic data.

In S290, the microcomputer 1 determines whether or not a condition for estimating the SOH indicating the degree of deterioration of the battery cell 7 (SOH estimation condition) is satisfied. The microcomputer 1 determines that the SOH estimation condition is satisfied when, for example, at a time point of voltage measurement used for SOC estimation, a predetermined time has elapsed since the ignition switch and the motor start switch were turned off. In this case, since the battery polarization is relaxed, the microcomputer 1 permits the SOH estimation.

When the microcomputer 1 determines in S290 that the SOH estimation condition is not satisfied, the flowchart of FIG. 5 is terminated without estimating the SOH. When the microcomputer 1 determines in S290 that the SOH estimation condition is satisfied, the microcomputer 1 estimates the SOH in S300 and terminates the flowchart of FIG. 5. The microcomputer 1 functions as an SOH estimation unit that estimates the SOH.

The microcomputer 1 may calculate the SOH (%) by the calculation using the following mathematical Equation (1) to estimate the SOH.

(Equation 1)

$$SOH = \frac{\int Idt}{SOC1 - SOC2} + \text{INITIAL FULL CHARGE CAPACITY} \times 100 \quad (1)$$

Figure 6:
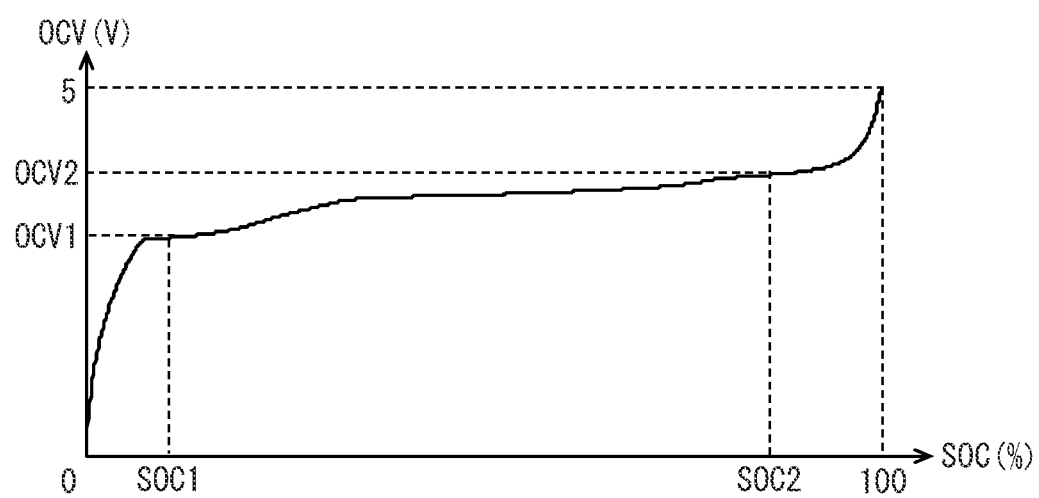
FIG. 6 is a characteristic diagram showing an operation related to SOH estimation.

FIG. 6 shows the characteristic data related to the battery cell 7 and the calculation for obtaining the SOH estimation. As shown in FIG. 6, SOC 1 and SOC 2 are estimated values of the SOC estimated using high precision voltage measurement values measured in a limited measurement range set by the microcomputer 1. The integrated value of I is calculated by integrating the values of the currents from SOC1 to SOC2. The initial full charge capacity is the full charge capacity at the time of manufacturing the battery cell 7, in other words, the full charge capacity at which deterioration has not started.

The battery management device 100 may perform the determination process in S290 by the following method. The microcomputer 1 may determine that the SOH estimation condition is satisfied when a measurement error of the voltage measuring device is smaller than the reference value. The microcomputer 1 may determine that the SOH estimation condition is satisfied when the voltage measuring device and the current measuring device are operating normally.

Third Embodiment

A third embodiment will be described with reference to FIG. 7. Control related to the battery management of the third embodiment will be described with reference to FIG. 7. Configurations, actions, and effects not specifically described in the third embodiment are the same as those in the first embodiment, and only points different from the first embodiment will be described below.

The control related to the battery management of the third embodiment is different from the control of the first embodiment in that at least a part of S110 is subdivided into S112, S114, and S116. In the flowchart of FIG. 7, the same step reference numerals are given to the same steps as those shown in FIG. 4.

Figure 7:
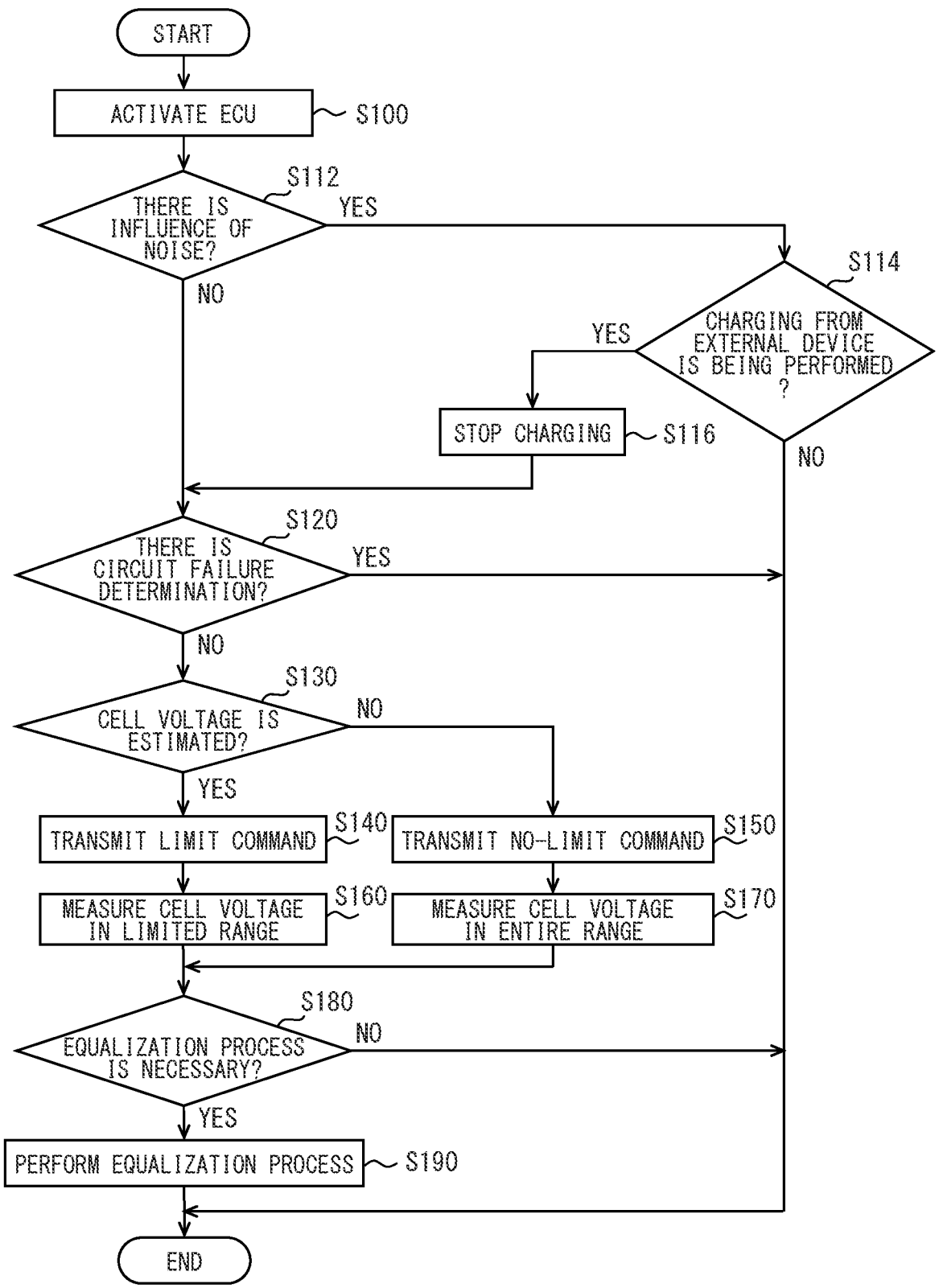
FIG. 7 is a flowchart showing battery management according to a third embodiment.

As shown in FIG. 7, in S112, the microcomputer 1 determines whether or not there is an influence of noise. When the microcomputer 1 determines that there is no influence of noise, the microcomputer 1 proceeds to S120. When the microcomputer 1 determines that there is an influence of noise, the microcomputer 1 performs the determination process of S114.

In S114, the control device 10 determines whether or not charging from the external device is currently being performed or is being prepared for the assembled battery 5. The external device is, for example, a charging facility 12. The external device includes a device that outputs AC power supplied from a small power generation facility or wide area power grid. The external device includes a power storage facility that outputs DC power, a storage battery, or the like.

When the microcomputer 1 determines in S114 that charging is not in progress or charging is not being prepared, the control device 10 terminates the flowchart of FIG. 7. When the microcomputer 1 determines in S114 that charging is in progress or charging is being prepared, the control device 10 performs a process of stopping charging or a process of stopping charging preparation in S116. After the charging is stopped in S116, the control device 10 performs the processes after S120 as described above. According to processes in S114 and S116, when the assembled battery 5 is being charged or is being prepared for charging, by stopping the charging, it is possible to reduce the influence of noise. As a result, a limited measurement range that enables highly accurate voltage measurement is set.

The third embodiment has the following effects. When the assembled battery 5 is being charged from an external power source, the range setting unit sets the limited measurement range and the measurement unit measures the battery voltage in the limited measurement range while the charging is temporarily stopped. According to this control, the battery management device 100 that can perform high precision voltage measurement even while the assembled battery 5 is being charged from an external device can be obtained.

Fourth Embodiment

A fourth embodiment will be described with reference to FIG. 8. Control related to the battery management of the fourth embodiment will be described with reference to FIG. 8. Configurations, actions, and effects not specifically described in the fourth embodiment are the same as those in the first embodiment, and only points different from the first embodiment will be described below.

The control according to the battery management of the fourth embodiment is different from the control of the first embodiment in that the fourth embodiment includes processes of S162, S164, and S166. In the flowchart of FIG. 8, the same step reference numerals are given to the same steps as those shown in FIG. 4.

Figure 8:
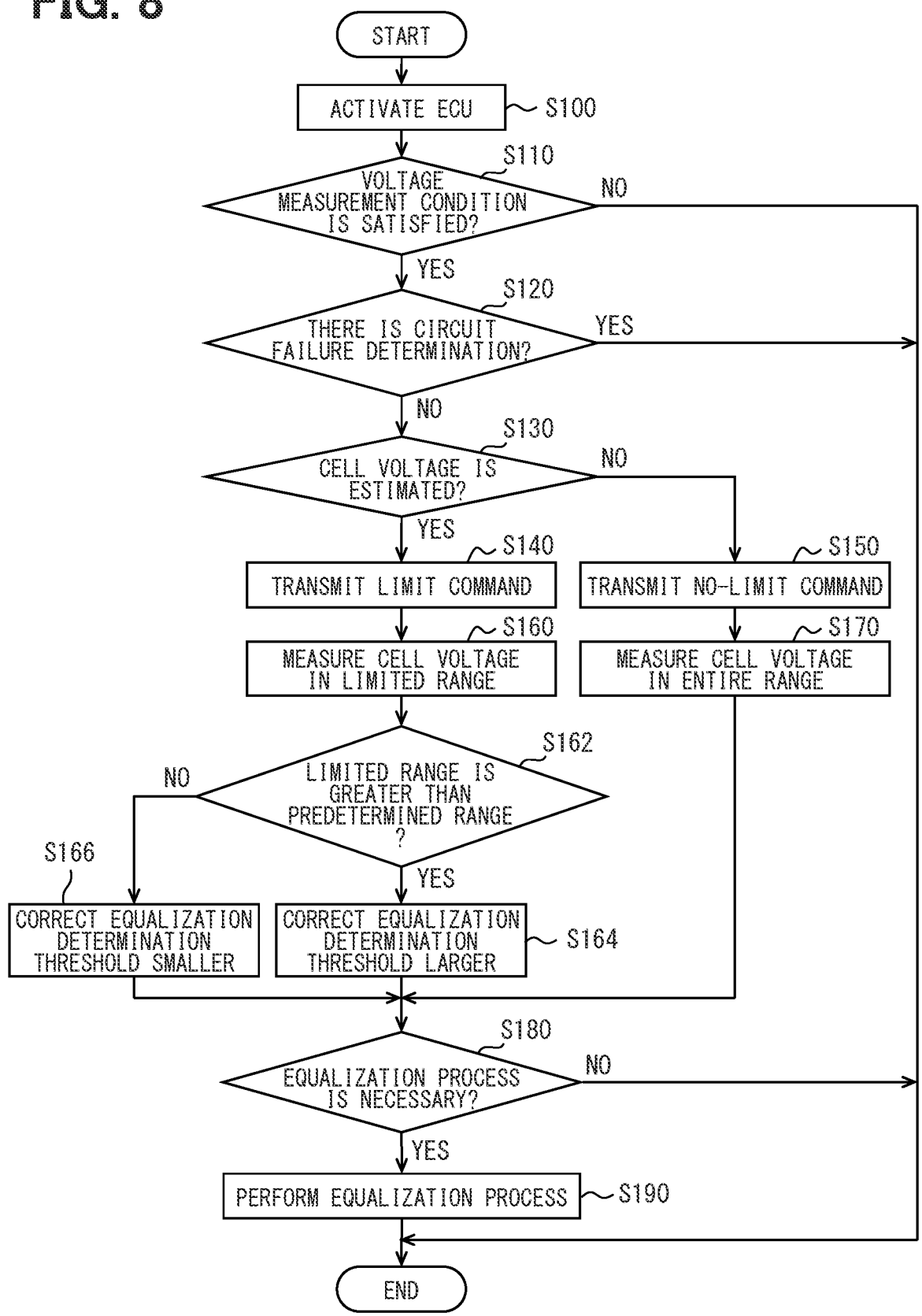
FIG. 8 is a flowchart showing battery management according to a third embodiment.

As shown in FIG. 8, after measuring the voltage in the limited measurement range in S160, the control device 10 performs a determination process in S162. In S162, the microcomputer 1 of the control device 10 functions as an equalization determination unit that determines a correction value of the determination threshold value used in the determination in S180 according to the width of the limited measurement range. When the width of the limited measurement range is greater than the predetermined range width stored in the storage unit 22, the microcomputer 1 corrects the determination threshold value to be great. When the width of the limited measurement range is smaller than the predetermined range width, the microcomputer 1 corrects the determination threshold value to be small.

When the width of the limited measurement range is greater than the predetermined range width, the microcomputer 1 proceeds to S164. The microcomputer 1 performs a process of determining the determination threshold value corrected in S164 to be greater. In S180, the microcomputer 1 determines whether or not the equalization process is performed depending on whether or not the voltage difference is greater than the corrected determination threshold value. When the determination threshold value is corrected to be greater in S164, the equalization process tends to be non-executed compared to before the correction.

When the width of the limited measurement range is smaller than the predetermined range width, the microcomputer 1 proceeds to S166. The microcomputer 1 performs a process of determining the determination threshold value corrected to be smaller in S166. In S180, the microcomputer 1 determines whether or not the equalization process is performed depending on whether or not the voltage difference is greater than the corrected determination threshold value. When the determination threshold value is corrected to be smaller in S166, the equalization process is likely to be performed compared to before the correction.

The microcomputer 1 may set the determination threshold value according to the width of the limited measurement range by the following method. The microcomputer 1 multiplies the width of the limited measurement range by a coefficient, and corrects the determination threshold value to be smaller as the width of the limited measurement range calculated in this way is smaller. The microcomputer 1 corrects the determination threshold value as the width of the limited measurement range calculated in this way becomes greater. When the difference between the maximum voltage measurement value and the minimum voltage measurement value measured in a predetermined battery group is smaller than a determination threshold value, the microcomputer 1 determines that the equalization process is not performed. When the difference between the maximum voltage measurement value and the minimum voltage measurement value is greater than the determination threshold value, the microcomputer 1 determines that the equalization process is performed.

The fourth embodiment has the following effects. The microcomputer 1 sets the determination threshold value according to the width of the limited measurement range. According to this control, the necessity of high precision equalization process is determined by using the determination threshold value set according to the width of the limited measurement range. As a result, highly accurate equalization process is performed.

When the width of the limited measurement range is greater than the predetermined range width, the microcomputer 1 corrects the determination threshold value to be great. When the width of the limited measurement range is smaller than the predetermined range width, the microcomputer 1 corrects the determination threshold value to be small. When the difference between the maximum voltage measurement value and the minimum voltage measurement value measured in a predetermined battery group among the multiple battery groups is smaller than a determination threshold value, the microcomputer 1 determines that the equalization process is not performed. When the difference between the maximum voltage measurement value and the minimum voltage measurement value is greater than the determination threshold value, the microcomputer 1 determines that the equalization process is performed.

According to this control, high precision equalization process can be performed by determining the necessity of equalization process based on the high precision voltage measurement value measured in the limited measurement range. Further, by using the determination threshold value corrected according to the width of the limited measurement range, the necessity of high precision equalization process is determined. As a result, highly accurate equalization process is performed.

Fifth Embodiment

Figure 9:
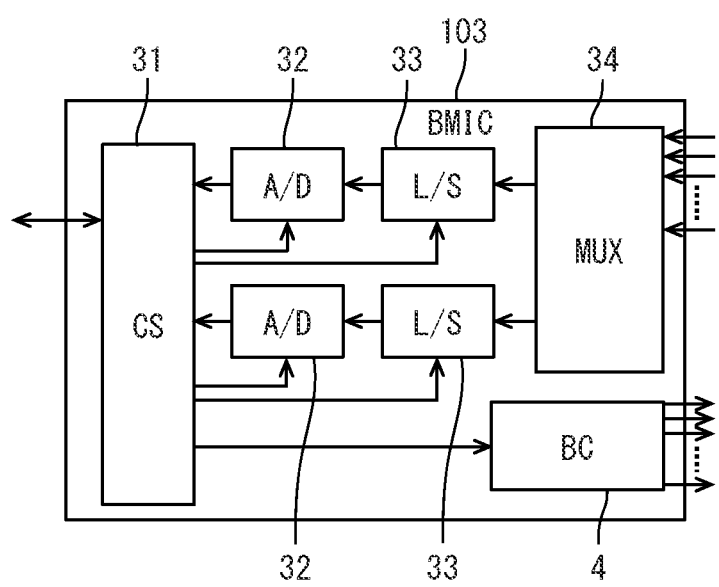
FIG. 9 is a configuration diagram of a monitoring IC according to a fifth embodiment.

A fifth embodiment will be described with reference to FIG. 9. FIG. 9 is a configuration diagram of a monitoring IC 103. Configurations, actions, and effects not specifically described in the fifth embodiment are the same as those in the first embodiment, and only points different from the first embodiment will be described below.

The monitoring IC 103 of the fifth embodiment includes a command unit 31, multiple analog-digital converters 32, multiple level shifters 33, and a switch group 34. The monitoring IC 103 further includes an equalization circuit 4. The analog-digital converters 32 and the level shifters 33 are provided so as to correspond to each other.

The monitoring IC 103 sets multiple different limited measurement ranges by a configuration in which multiple analog-to-digital converters 32 are provided for one switch group 34. The monitoring IC 103 functions as a measuring unit that measures the voltage of the battery cell 7 in the multiple limited measurement ranges. Each analog-digital converter 32 may be configured to have a function of setting a predetermined limited measurement range. In this case, the multiple analog-to-digital converters 32 and the multiple level shifters 33 provided corresponding to one battery group are configured to set different predetermined limited measurement ranges.

A range setting unit of the fifth embodiment sets multiple different limited measurement ranges. With this configuration, appropriate voltage measurement is performed for the multiple battery cells 7.

Further, the monitoring IC 103 includes the multiple level shifters 33 and the multiple analog-digital converters 32 for one switch group 34. Therefore, the voltages of the multiple battery cells 7 can be measured quickly.

When the switch group 34 selects the voltages of the multiple battery cells 7 one by one, the voltage measurement range of each of the multiple battery cells 7 may be set by the analog digital converter 32 and the level shifter 33. Such a configuration is applicable to all embodiments and modifications.

Further, when the switch group 34 selects the voltages of the multiple battery cells 7 included in the battery group, the analog-digital converter 32 and the level shifter 33 may set a common voltage measurement range for at least a part of the multiple battery cells 7. In such a configuration, a common voltage measurement range may be set as a limited measurement range based on at least one of a maximum value and a minimum value of voltages measured by the selected battery cells 7. Such a configuration is applicable to all embodiments and modifications.

Sixth Embodiment

A sixth embodiment will be described with reference to FIGS. 10 to 12.

In the first embodiment, an example is shown in which the microcomputer 1 sets the voltage measurement range of the battery cell 7 when the power device of the vehicle is stopped. An example is shown in which the microcomputer 1 sets the voltage measurement range of the battery cell 7 when the ignition switch of the vehicle is in the off state.

On the other hand, in the present embodiment, the microcomputer 1 sets the voltage measurement range of the battery cell 7 when the ignition switch of the vehicle is in an on state. The microcomputer 1 performs the setting of the voltage measurement range and the voltage detection as a cycle task.

First, the voltage detection of the battery cell 7 will be described in detail with reference to FIG. 10. FIG. 10 shows the voltage change over time of the battery cell 7. The vertical axis is an arbitrary unit. The horizontal axis is time. The arbitrary unit is indicated by a. u. The time is indicated by T.

The battery cell 7 has an internal resistance. Therefore, there is a difference between the open circuit voltage according to the SOC of the battery cell 7 and the closed circuit voltage detected by the monitoring IC 3 by the voltage drop according to the internal resistance and the current flowing through the battery cell 7. In the following, the voltage of the battery cell 7 detected by the monitoring IC 3 will be unified with the closed circuit voltage.

Figure 10:
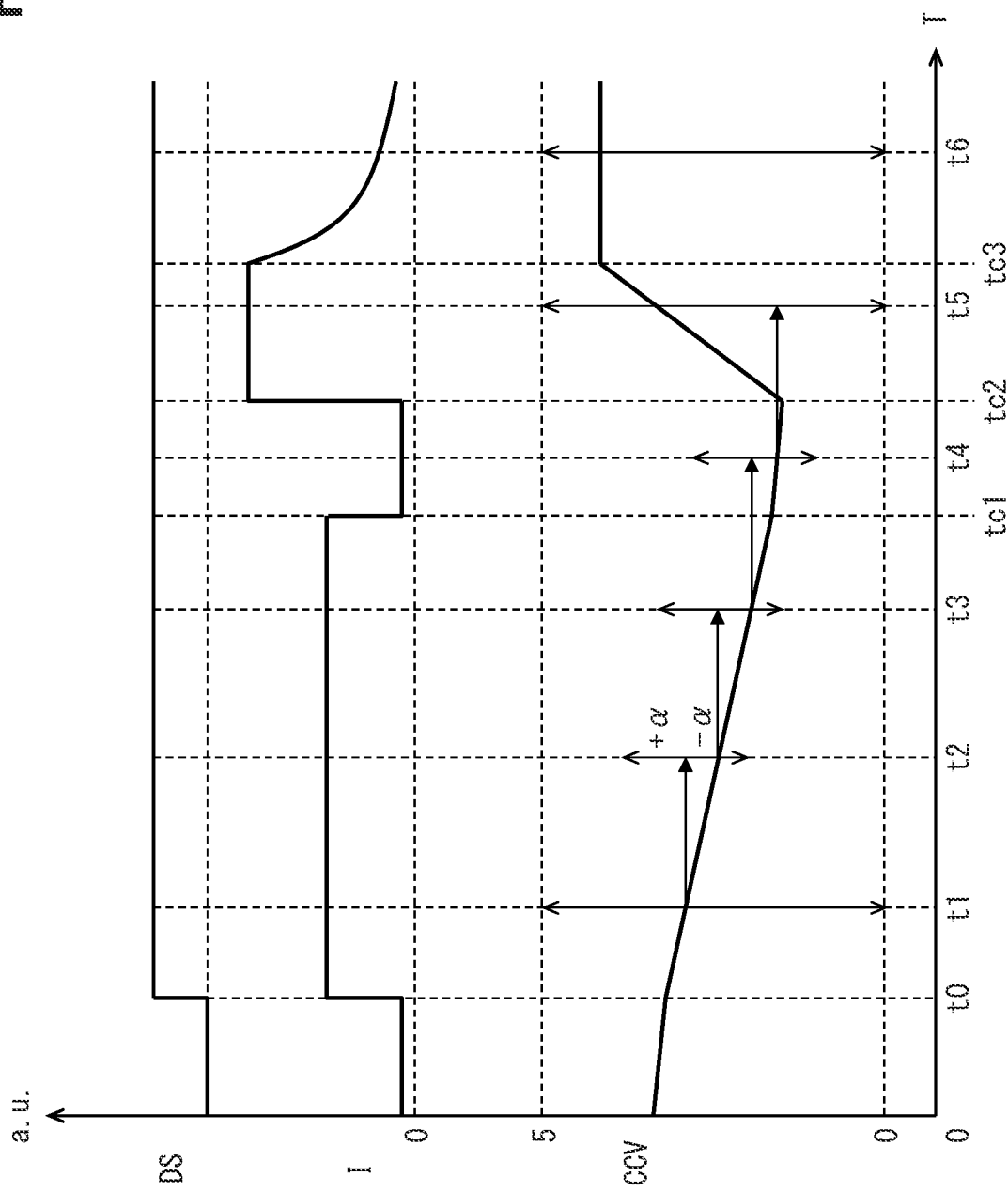
FIG. 10 is a timing chart showing voltage detection.

In addition to the closed circuit voltage, FIG. 10 shows the driving state of the battery management device 100, the actual current flowing through the assembled battery 5, and the closed circuit voltage of one battery cell 7. The driving state of the battery management device 100 is described as DS. For the sake of simplicity, the behavior of the closed circuit voltage of the battery cell 7 and the behavior of the closed circuit voltage of the assembled battery 5 shown in the drawings are assumed to be the same. In order to clarify the behavior, the drawing shows that the closing voltage of the battery cell 7 changes significantly in a short time.

In the initial state of time 0, the ignition switch of the vehicle is turned off. The battery management device 100 is in a non-driving state. Battery information such as the closed circuit voltage is not stored in the storage unit 22. The system main relay 6 that controls the conduction state between the assembled battery 5 and various in-vehicle devices is in the cutoff state. Therefore, no current is substantially flowing through the assembled battery 5. The closed circuit voltage of the battery cell 7 is a value in the low change region.

Even when no current is flowing through the battery cell 7, the SOC of the battery cell 7 decreases due to self-discharge. Therefore, in the initial state of time 0, the closing voltage of the battery cell 7 tends to decrease in a small amount.

At time t0, the ignition switch of the vehicle changes from the off state to the on state. The battery management device 100 changes from the non-driving state to the driving state. The system main relay 6 changes from the cutoff state to the electrical conduction state. As a result, the supply of power supply power from the assembled battery 5 to various in-vehicle devices is started. The actual current begins to flow in the assembled battery 5. The rate of decrease in the SOC of the battery cell 7 increases. Along with this configuration, the rate of decrease in the closing voltage of the battery cell 7 also increases.

At time t1, the microcomputer 1 acquires the closed voltage of the battery cell 7. At this time, the battery information is not stored in the storage unit 22. Therefore, the microcomputer 1 sets the voltage measurement range at time t1 to the entire range. That is, the microcomputer 1 sets the voltage measurement range to 0.0 V to 5.0 V.

At time t2, the microcomputer 1 acquires the closed voltage of the battery cell 7 again. At this time, the microcomputer 1 determines the center value of the limited measurement range at the time t2 based on the closed circuit voltage of the battery cell 7 acquired at the time t1. Further, the microcomputer 1 determines the range width α of the limited measurement range.

The voltage measurement range is indicated by the width of the arrows on both ends of the solid line shown in FIG. 10. The difference between the center value and the upper or lower limit value of the limited measurement range is set to the range width α. The range width α is a value greater than the detection error of the closed circuit voltage. The range width α is a value smaller than half of the difference between OCV1 and OCV2 shown in FIG. 6. The difference between the center value and the upper limit value and the difference between the center value and the lower limit value may be the same or different. In this embodiment, the range width α is set to a fixed value. The range width α is stored in the storage unit 22. Therefore, the limited measurement range is substantially determined based on the closed circuit voltage. The microcomputer 1 sets the limited measurement range based on the range width α and the acquired closed circuit voltage. The microcomputer 1 sets, for example, the limited measurement range of the time t2 to 2.8V to 3.2V. The microcomputer 1 acquires the closed circuit voltage detected by the monitoring IC 3 in the limited measurement range at this time t2.

Strictly speaking, since the battery management device 100 performs an arithmetic process, the timing of determining the limited measurement range and the timing of acquiring the closed circuit voltage at time t2 are not the same. The determination timing is before the acquisition timing. However, the difference between these two timings is small. Therefore, these two timings are regarded as the same and described.

The microcomputer 1 acquires the closed circuit voltage in an acquisition cycle. This acquisition cycle is an expected time interval in which the SOC of the battery cell 7 does not suddenly change unless the charge or discharge state of the battery cell 7 suddenly changes due to rapid charging or the like. The acquisition cycle is a time interval in which it is expected that the amount of change in the closed circuit voltage of the battery cell 7 does not exceed the range width α. When the acquisition cycle elapses from the time t1, the time becomes t2.

When the acquisition cycle elapses from the time t2, the time becomes t3. At the time t3, the microcomputer 1 determines the limited measurement range based on the closed circuit voltage at the time t2. The microcomputer 1 sets, for example, the limited measurement range of the time t3 to 2.6 V to 3.0 V. The microcomputer 1 acquires the closed circuit voltage of the battery cell 7 detected by the monitoring IC 3 in the limited measurement range.

When the time t3 changes to the time tc1, the driving state of the vehicle changes. The actual current is reduced. Along with this configuration, the reduction rate of the closed circuit voltage is also reduced.

When the acquisition cycle elapses from the time t3, the time becomes t4. At the time t4, the microcomputer 1 determines the limited measurement range based on the closed circuit voltage at the time t3. The microcomputer 1 sets, for example, the detection range of the time t4 to 2.4 V to 2.8 V. The microcomputer 1 acquires the closed circuit voltage of the battery cell 7 detected by the monitoring IC 3 in the limited measurement range.

From time t4 to time tc2, the charging equipment 12 is connected to the vehicle via the charging terminal 11. The assembled battery 5 is quickly charged by the charging equipment 12. As a result, the actual current rises sharply. The microcomputer 1 acquires such information from the charging equipment 12. At this time, the microcomputer 1 sets the voltage measurement range to the entire range.

When the acquisition cycle elapses from the time t4, the time becomes t5. At the time t5, the microcomputer 1 acquires the closed circuit voltage of the battery cell 7 detected by the monitoring IC 3 in the entire range. Due to the change in the voltage measurement range, as shown in FIG. 10, even when the cycle closing voltage suddenly rises from the time tc2, the cycle closing voltage detected at the time t5 is in the voltage measurement range.

When the time t5 changes to the time tc3, the output voltage of the assembled battery 5 reaches the target voltage. When the reach is detected, the microcomputer 1 terminates the quick charging by the charging equipment 12. The microcomputer 1 causes the charging equipment 12 to perform a full charge.

The amount of current supplied differs between the quick charge and the full charge. The quick charge has a larger supply current than full charge.

There is a difference in voltage drop between the closed circuit voltage and the open circuit voltage. Therefore, for example, even when the maximum output voltage of the assembled battery 5 is detected as the closed circuit voltage, the open circuit voltage does not reach the maximum output voltage. The SOC of the assembled battery 5 has not reached the full charge capacity.

The above target voltage is a value based on the maximum output voltage of the assembled battery 5. When the microcomputer 1 determines that the output voltage of the assembled battery 5 has reached the target voltage, the microcomputer 1 causes the charging equipment 12 to fully charge the battery. In full charging, charging power is supplied to the assembled battery 5 while keeping the output voltage of the assembled battery 5 at the target voltage in order to bring the SOC of the assembled battery 5 closer to the full charge capacity while avoiding overcharging. The target voltage and the maximum output voltage are stored in advance in the storage unit 22.

When the acquisition cycle elapses from the time t5, the time becomes t6. At the time t6, the microcomputer 1 acquires the closed circuit voltage of the battery cell 7 detected by the monitoring IC 3 in the entire range. At this time, it is expected that the output voltage of the assembled battery 5 has reached the target voltage. Therefore, the closed circuit voltage may be detected in the voltage measurement range based on this target voltage.

Seventh Embodiment

A seventh embodiment will be described with reference to FIG. 11.

In the sixth embodiment, as described with reference to FIG. 10, when the non-driving state is switched to the driving state, the microcomputer 1 acquires the closed circuit voltage detected by the monitoring IC 3 in the entire range.

On the other hand, in the present embodiment, when the non-driving state is switched to the driving state, the microcomputer 1 acquires the closed circuit voltage detected by the monitoring IC 3 in a usable range of the battery cell 7. In this configuration, even when the battery management device 100 is switched from the non-driving state to the driving state, the detection accuracy of the closed circuit voltage can be improved.

Figure 11:
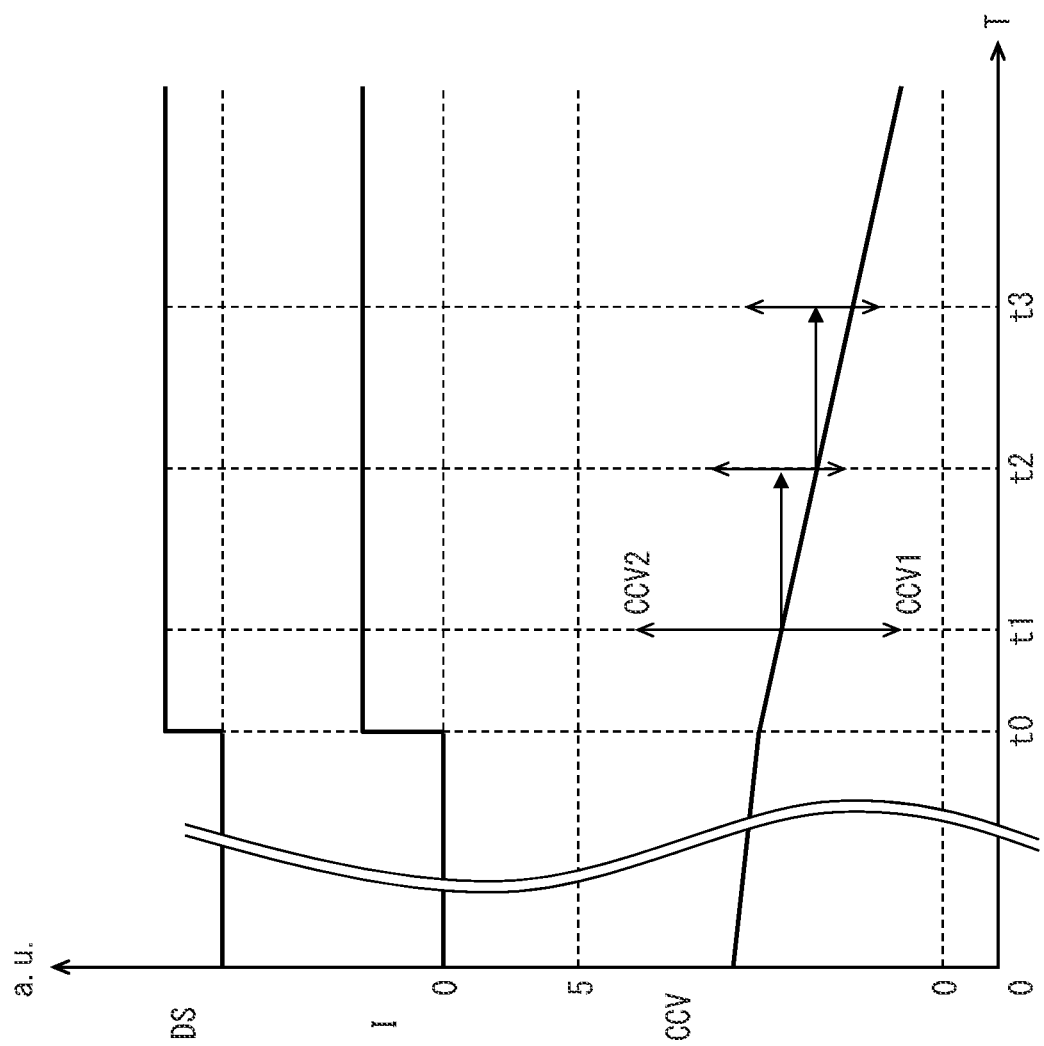
FIG. 11 is a timing chart showing voltage detection.

For example, at the time t0 shown in FIG. 11, the battery management device 100 changes from the non-driving state to the driving state. The system main relay 6 changes from the cutoff state to the electrical conduction state. Current begins to flow in the assembled battery 5. The reduction rates of the SOC and the closed circuit voltage of the battery cell 7 increase.

From the time t0 to the time t1, the microprocessor 1 sets a limited measurement range based on the characteristic data of the SOC and OCV shown in FIG. 6. The microcomputer 1 sets, for example, the usable range of the battery cell 7 between the SOC1 and the SOC2 shown in FIG. 6. Then, the microcomputer 1 sets the limited measurement range based on the OCV1 and the OCV2 respectively corresponding to the SOC1 and the SOC2. As shown in FIG. 11, the microcomputer 1 sets the lower limit value of the limited measurement range as CCV1 and the upper limit value as CCV2.

The characteristic data shown in FIG. 6 depends on the temperature. There is a difference in voltage drop between the open circuit voltage and the closed circuit voltage. Therefore, the microcomputer 1 may set a limited measurement range in consideration of not only the characteristic data shown in FIG. 6 but also the temperature, current, deterioration degree, or the like of the battery cell 7 at the time t1.

In order to clarify the distinction from the entire range described in the other embodiments, it is described in the present embodiment that the microcomputer 1 sets the voltage measurement range at time t1 to the limited measurement range as described above. However, the battery cell 7 is used in the usable range. Therefore, it is expected that the detected closing voltage is in the usable range. Therefore, the usable range may be set to the entire range. Such settings can also be applied to other embodiments and modifications.

Eighth Embodiment

An eighth embodiment will be described with reference to FIG. 12.

In the above-described embodiments, regardless of the execution of the equalization process, the microcomputer 1 acquires the closed circuit voltage of each of the multiple battery cells 7. On the other hand, in the present embodiment, after the equalization process is performed, the microcomputer 1 acquires a part of the closed circuit voltage of the multiple battery cells 7.

When the equalization process is performed, the SOC of each of the multiple battery cells 7 is equalized. Therefore, it is expected that the closing voltages of the multiple battery cells 7 are the same. Therefore, after the equalization process is performed, the monitoring IC 3 detects the closed circuit voltage of a part of the multiple battery cells 7. The microcomputer 1 acquires the closed circuit voltage detected by the monitoring IC3. This configuration simplifies the arithmetic processing of the monitoring IC 3 and the microcomputer 1.

The monitoring IC 3 may detect the closed circuit voltages of all the battery cells 7. Then, the microcomputer 1 may acquire a part of the multiple closed circuit voltages detected by the monitoring IC 3. This configuration simplifies the arithmetic processing of the microcomputer 1.

However, after a certain amount of time has passed since the equalization was performed, the SOCs of the multiple battery cells 7 vary. The closing voltage of each of the multiple battery cells 7 becomes unequal.

Figure 12:
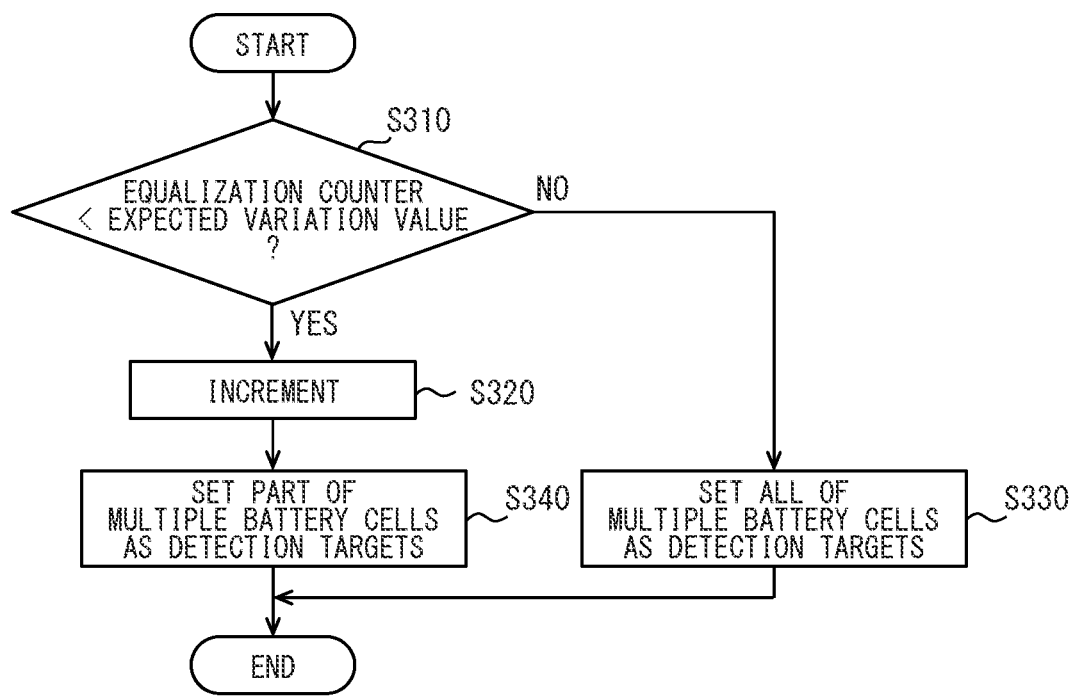
FIG. 12 is a flowchart showing an acquisition target setting processing.

Therefore, the microcomputer 1 performs an acquisition target setting process shown in FIG. 12. The microcomputer 1 performs this acquisition target setting process as a cycle task. The microcomputer 1 performs this acquisition target setting process in parallel with other battery management shown in, for example, FIGS. 4 and 10.

In S310, the microcomputer 1 determines whether or not the equalization counter held by the microcomputer 1 is smaller than the expected variation value stored in the storage unit 22. When the microcomputer 1 determines that the equalization counter is smaller than the expected variation value, the microcomputer 1 proceeds to S320. When the microcomputer 1 determines that the equalization counter is equal to or greater than the expected variation value, the microcomputer 1 proceeds to S330.

The value of the equalization counter is cleared when the equalization process is performed. The expected variation value is determined based on the time when the closing voltages of the multiple battery cells 7 are expected to be inconsistent after the equalization process is performed.

Proceeding to S320, the microcomputer 1 increments the equalization counter. Then, the microcomputer 1 proceeds to S340.

When the process proceeds to step S340, the microcomputer 1 sets only a part of the multiple battery cells 7 for which the equalization process has been performed as the acquisition target (voltage measurement target) of the closed circuit voltage. For example, the microcomputer 1 sets one of the multiple battery cells 7 included in one battery group as a target for acquiring a closed circuit voltage. For example, the microcomputer 1 sets one of all battery cells 7 included in one battery group as a target for acquiring a closed circuit voltage. Then, the microcomputer 1 terminates the acquisition target setting process.

When it is determined in S310 that the equalization counter is equal to or greater than the expected variation value and the process proceeds to S330, the microcomputer 1 sets all of the multiple battery cells 7 as targets for acquiring the closed circuit voltage. Then, the microcomputer 1 terminates the acquisition target setting process.

After the equalization process is performed, the microcomputer 1 repeatedly executes S310, S320, and S340. During this period, only a part of the closed circuit voltage of the multiple battery cells 7 for which the equalization process has been performed is set as the acquisition target.

After that, when the equalization counter reaches the expected variation value, the microcomputer 1 repeatedly executes S330. After that, all the closing voltages of the multiple battery cells 7 are set as acquisition targets until the equalization process is performed again.

Other Embodiments

The disclosure in the present specification is not limited to the illustrated embodiments. The disclosure encompasses the illustrated embodiments and variations thereof by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure encompasses the omission of parts and elements of the embodiments. The disclosure encompasses the replacement or combination of components, elements between one embodiment and another. The disclosed technical scope is not limited to the description of the embodiment. It should be understood that the disclosed technical scope is defined in claims and includes meanings equivalent to the claims and all modifications in the scope of the claims.

(Other Modifications)

The battery management device 100 is not limited to the configuration in which the monitoring IC 3 is provided for each battery group. The battery management device 100 may have a monitoring IC 3 and a microcomputer 1 for the assembled battery 5. The battery management device 100 may include one microcomputer 1 for each battery group.

What is claimed is:

1. A battery management device comprising:
   a range setting unit configured to set a limited measurement range that limits a range for measuring a voltage of each of a plurality of batteries for a vehicle, and
   a measuring unit configured to measure the voltage of each of the plurality of batteries within the limited measurement range,
   wherein
   the range setting unit sets the limited measurement range adjusted based on a voltage value of each of the plurality of batteries when the voltage value of each of the plurality of batteries is to be estimated, and
   the range setting unit sets the limited measurement range based on a measurement value for the voltage of each of the plurality of batteries within an entire range when the voltage value of each of the plurality of batteries is not to be estimated.

2. The battery management device according to claim 1, wherein
   the range setting unit sets the limited measurement range by using at least one of a maximum value and a minimum value of the measurement value for the voltage of each of the plurality of batteries measured within the entire range.

3. A battery management device comprising:
   a range setting unit configured to set a limited measurement range that limits a range for measuring a voltage of each of a plurality of batteries for a vehicle, and
   a measuring unit configured to measure the voltage of each of the plurality of batteries within the limited measurement range,
   wherein
   the range setting unit sets the limited measurement range and the measuring unit measures the voltage within the limited measurement range when a noise level is acceptable in a situation where a noise is acceptable, and
   the range setting unit sets the limited measurement range and the measuring unit measures the voltage within the limited measurement range when a power device that provides a driving force of the vehicle is stopped and charging or discharging of each of the plurality of batteries is stopped.

4. A battery management device comprising:
   a range setting unit configured to set a limited measurement range that limits a range for measuring a voltage of each of a plurality of batteries for a vehicle, and
   a measuring unit configured to measure the voltage of each of the plurality of batteries within the limited measurement range,
   further comprising
   an equalization determination unit configured to determine whether or not to perform an equalization process for reducing a voltage variation for a predetermined battery group including at least a part of the plurality of batteries, wherein
   the equalization determination unit determines whether or not to perform the equalization process based on a measurement value for the voltage of each of the plurality of batteries measured within the limited measurement range.

5. The battery management device according to claim 4, wherein
   when the equalization process is performed on batteries included in the predetermined battery group, the equalization determination unit selects a part of the batteries included in the predetermined battery group as a target for which a voltage is to be measured.

6. A battery management device comprising:
   a range setting unit configured to set a limited measurement range that limits a range for measuring a voltage of each of a plurality of batteries for a vehicle, and
   a measuring unit configured to measure the voltage of each of the plurality of batteries within the limited measurement range,
   further comprising
   an equalization determination unit configured to determine whether or not to perform an equalization process for reducing voltage variation for a predetermined battery group including at least a part of the plurality of batteries, wherein
   the equalization determination unit sets a determination threshold value according to a width of the limited measurement range,
   when a difference between a maximum voltage measurement value and a minimum voltage measurement value each measured for the predetermined battery group is smaller than the determination threshold value, the equalization determination unit determines not to perform the equalization process, and
   when the difference is greater than the determination threshold value, the equalization determination unit determines to perform the equalization process.

7. The battery management device according to claim 6, wherein
   when the width of the limited measurement range is greater than a predetermined range width, the equalization determination unit corrects the determination threshold value to be greater, and
   when the width of the limited measurement range is smaller than the predetermined range width, the equalization determination unit corrects the determination threshold value to be smaller.

8. A battery management device comprising:
   a range setting unit configured to set a limited measurement range that limits a range for measuring a voltage of each of a plurality of batteries for a vehicle, and
   a measuring unit configured to measure the voltage of each of the plurality of batteries within the limited measurement range,
   wherein
   when the battery management device is switched from a non-driving state to a driving state, the range setting unit sets the range for measuring the voltage to a usable range of each of the plurality of batteries.

9. A battery device comprising:
   a plurality of batteries for a vehicle;
   a range setting unit configured to set a limited measurement range that limits a range for measuring a voltage of each of the plurality of batteries; and
   a measuring unit configured to measure the voltage of each of the plurality of batteries within the limited measurement range, wherein
the range setting unit sets the limited measurement range adjusted based on a voltage value of each of the plurality of batteries when the voltage value of each of the plurality of batteries is to be estimated, and
the range setting unit sets the limited measurement range based on a measurement value for the voltage of each of the plurality of batteries within an entire range when the voltage value of each of the plurality of batteries is not to be estimated.

\* \* \* \* \*